United States Patent [19]

Ohmori

[11] Patent Number: 4,541,071
[45] Date of Patent: Sep. 10, 1985

[54] DYNAMIC GATE ARRAY WHEREBY AN ASSEMBLY OF GATES IS SIMULATED BY LOGIC OPERATIONS ON VARIABLES SELECTED ACCORDING TO THE GATES

[75] Inventor: Kenji Ohmori, Tokyo, Japan
[73] Assignee: NEC Corporation, Tokyo, Japan
[21] Appl. No.: 514,900
[22] Filed: Jul. 18, 1983
[30] Foreign Application Priority Data
Jul. 16, 1982 [JP] Japan ................... 57-123870
[51] Int. Cl.³ .................. G06F 7/04; G06F 13/00
[52] U.S. Cl. ................................ 364/900
[58] Field of Search ... 364/200 MS File, 900 MS File, 364/434

[56] References Cited

U.S. PATENT DOCUMENTS

| | | | |
|---|---|---|---|
| 3,983,541 | 9/1976 | Faber et al. | 364/200 |
| 4,001,787 | 1/1977 | Kimmel et al. | 364/200 |
| 4,011,547 | 3/1977 | Kimmel et al. | 364/200 |
| 4,472,780 | 9/1984 | Chenoweth et al. | 364/434 |

*Primary Examiner*—Harvey E. Springborn
*Attorney, Agent, or Firm*—Sughrue, Mion, Zinn, Macpeak and Seas

[57] ABSTRACT

A gate assembly is simulated as logic groups, which are successively checked in steps for input signals of the respective logic groups to provide output signals thereof. A decode memory (24) is preliminarily loaded with decoding patterns. A pair of decoding patterns define a pair of variable sets which are preliminarily decided for each gate as regards a logic signal pair of each logic group input signal. In a gate memory unit (25), the variable pair is subjected to a logic operation decided for the gate to provide a logic signal of the logic group output signal. At first, a register set (15) is loaded with an input signal of the assembly. Later, the register set is loaded with the output signal of each logic group, which output signal is used in a next succeeding step as the input signal of another logic group. Preferably, each logic group input signal is given by eight logic signals. In this event, each logic signal may be given as a permutation of logic one and/or zero states, sixteen in number.

3 Claims, 8 Drawing Figures

| LEVELS | R1 | R2 | R3 | R4 |
|---|---|---|---|---|
| 1 | Ci A1 A2 A3 B1 B2 B3 | A4 B4 | | |
| 1' | | | u1 u2 u3 u4 | u5 u6 u7 u8 u9 |
| 2 | | | u1 u2 u3 u4 u5 u6 u7 u9 | u5 u6 u7 u8 u9 |
| 3 | v1 v2 v3 v4 v5 | v6 v7 v8 v9 v10 v11 v12 v13 | v15 v16 v17 v18 v19 | v14 |
| 4 | w1 w2 w3 w4 w5 w6 | w7 w8 | w9 | |
| 5 | S1 S2 S3 S4 | Co | | |
| 5' | S1 S2 S3 S4 Co | | | |

4,541,071

DYNAMIC GATE ARRAY WHEREBY AN ASSEMBLY OF GATES IS SIMULATED BY LOGIC OPERATIONS ON VARIABLES SELECTED ACCORDING TO THE GATES

BACKGROUND OF THE INVENTION

This invention relates to a dynamic gate array for use in simulating operation of a logic circuit composed of an assembly or combination of a plurality of various gates. The assembly is, for example, what is to be implemented as wired logics in a custom LSI.

A dynamic gate array serves as an effective tool in simulating a combination of logic operations and in designing an assembly of gates for which the logic operation is not yet ultimately decided.

Custom LSI's are useful in reducing the size and price of hardware devices composed of logic circuits. New custom LSI's are therefore often designed in consideration of the hardware devices which are to be developed. It is, however, impossible to change or amend the logics which are once implemented or wired in a custom LSI as wired logics. A tool which makes it readily possible to change the logics, is therefore eagerly desired on trially manufacturing or simulating those hardware devices for which the logics are not yet settled.

Examples of the tool now available on designing hardware devices are IC's, programmable logic arrays, gate arrays, and the like. The IC's are assembled or combined so as to actually implement a hardware device. The logics are changed as desired. The actual implementation is, however, troublesome. Alteration of the logics is time consuming. The programmable logic array must be manufactured afresh on changing the logics. Moreover, the programmable logic array can not implement a hardware device on a large logic scale. The gate array must also be fabricated anew on amending the logics. It is expensive to manufacture new gate arrays.

Software simulations have also been tried instead of such hardware tools. It is, however, impossible with the software simulation to inspect the whole logics when the simulation is carried out for partial logics on a small logic scale. Simulation must therefore be carried out for appreciably large-scale modules and, in an extreme case, for the whole device. At any rate, the simulation must actually be carried out in sequence for individual logic operations of the whole device. The sequential simulation results in a long simulation time, which is intolerably long in practice.

It has therefore been desired to provide a hardware tool for use in simulating an assembly of gates before settlement of the logics. The hardware tool must be capable of carrying out the simulation in a shortest possible time. As described in patent application Ser. No. 513,489 filed July 13, 1983, by Tohru Sasaki with claim to the Convention Priorities based on three patent applications filed in Japan under patent application Ser. Nos. 121,599, 121,600, and 177,073, all of 1982, such a hardware tool is useful also in a logic simulator for use in simulating an overall operation of a logic device which may be an electronic digital computer comprising a central processing unit, a main memory, a cache memory, and microprogram memories.

SUMMARY OF THE INVENTION

It is therefore an object of the present invention to provide a dynamic gate array which well serves as a hardware tool for use in simulating various assemblies of gates.

It is another object of this invention to provide a dynamic gate array of the type described, which is capable of implementing various combinations of logic operations.

A dynamic gate array according to this invention is operable to astonishingly facilitate development of devices in which custom LSI's are used. The dynamic gate array alleviates the heavy burden which design engineers have had to endure. The dynamic gate array shortens the time required on designing such devices, facilitates completion of the design, and reduces the expense of design.

On summarizing the structure of a dynamic gate array, the logic assembly or combinations will be called a combination of logic groups because a hardware device to be implemented, is equivalently divisible into groups of logics which represent blocks of gates on simulating the hardware device. Each elementary signal which the logic group combination deals with, is a binary signal capable of taking the logic one and/or zero states. The elementary signal to which each logic group is responsive, will collectively be called an input signal. At least one elementary signal which the logic group provides, will be called an output signal. Depending on the circumstances, the input and the output signals will be called with addition of a modifier "group" because the signals relate to the logic groups. The logic group is given one of the input signals and provides one of the output signals. The signals given to the combination and thereby provided, are called a primitive and a derived signal, respectively.

A dynamic gate array to which this invention is applicable, is for simulating an overall operation carried out by a combination of logic groups on a primitive signal to provide a derived signal. The logic groups are responsive to input signals for providing output signals, respectively, and are operable in response to the primitive signal given as a particular one of the input signals in steps to eventually provide a specific one of the output signals as the derived signal. The dynamic gate array comprises register means, decode memory means, gate memory means, and step specifying means as follows.

The register means is for storing a plurality of logic signals assigned to the steps.

The decode memory means is for memorizing a plurality of decoding patterns assigned to the steps. Each decoding pattern defines a set of dependent variables for a set of independent variables. The dependent variable sets are decided by the logic groups for the independent variable sets which the input signals are representative of.

The gate memory means is for memorizing a plurality of logic operations assigned to the steps.

The step specifying means is for successively specifying the steps for the logic signals, the decoding patterns, and the logic operations to specify, when each step is specified, at least one of the logic signals, at least two of the decoding patterns, and at least one of the logic operations. The at least one logic signal collectively serves as one of the input signals. The step specifying means thereby provides those at least two of the dependent variable sets which are defined by the at least two decoding patterns for those at least two of the independent variable sets which the last-mentioned one input signal is representative of, subjects the at least two dependent variable sets to the at least one logic operation to provide one of the output signals that is provided in response to the last-mentioned one input signal, and stores the last-mentioned one output signal in the register means as at least one of the logic signals that is assigned to the step being specified.

BRIEF DESCRIPTION OF THE DRAWING

FIG. 8 shows various steps of simulation carried out by the dynamic gate array illustrated in FIG. 2, the registers, and logic operations carried out by the gate memory unit.

DESCRIPTION OF THE PREFERRED EMBODIMENTS

Figure 1:
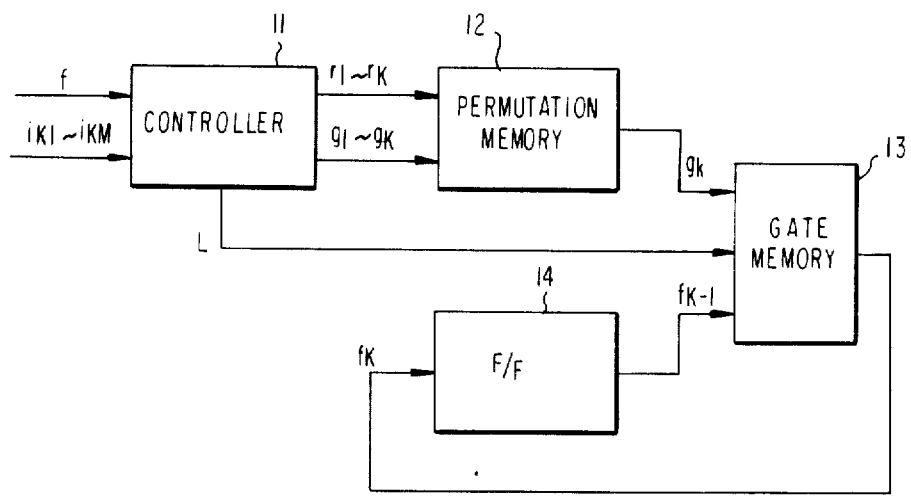
FIG. 1 is a block diagram of an equivalent circuit of a gate and is for use as a simplified embodiment of the instant invention in describing the principles on which this invention is based.

Referring to FIG. 1, an equivalent circuit of a gate will be described in order to facilitate an understanding of the principles on which the present invention is based. It is possible to understand that the equivalent circuit shows a dynamic gate array according to a simplified embodiment of this invention.

As has already been mentioned heretobefore, a dynamic gate array is for use in dynamically simulating an assembly of various gates. In other words, the dynamic gate array is for use in simulating an overall operation carried out by the gate assembly on a plurality of elementary or one-bit signals supplied to the assembly as a primitive signal to produce at least one elementary signal as a derived signal.

As will later become clear as the description proceeds, the gates of the assembly are divisible into a plurality of levels in compliance with flow of the elementary signals through the assembly. The gates on each level form a block of various gates. The gate block is supplied with a plurality of elementary signals in parallel as a block input signal to produce, in general, a plurality of elementary signals as a block output signal. In other words, the gates on each level are concurrently operable.

Each gate of the gate assembly or of the gate blocks may be an AND gate, a NAND gate, an OR gate, a NOR gate, an EOR gate, or a NEOR gate operable in response to a plurality of elementary signals which are delivered to the gate either as they are or after inverted. It is known that a NAND gate is equivalent to an OR gate supplied with every elementary signal inverted, that a NOR gate is equivalent to an AND gate supplied with every elementary signal inverted, and that a NEOR gate is equivalent to an EOR gate to which only one of the elementary signals is supplied as an inverted signal.

Attention will therefore be directed only to AND, OR, and EOR gates. Stated otherwise, each gate carries out one of AND, OR and EOR logic operations. The AND gate may be a single input gate which is supplied with only one elementary signal.

The dynamic gate array being illustrated, is therefore for use in dynamically simulating an AND, OR, or EOR gate. The gate produces only one elementary signal.

It will be assumed that the gate is a K-input gate supplied with first through K-th elementary signals $I_1$ to $I_K$ and that each elementary signal $I_k$ successively takes first through M-th logic states $i_{k1}$ to $i_{kM}$. Insofar as continuously supplied, the elementary signal may take a long succession of logic one and/or zero states. It is, however, sufficient according to this invention to take only a finite number M of the logic states into consideration as will presently be described.

The single elementary signal which the gate produces, is a sequence of logic one and/or zero states which are decided by the logic states of the elementary signals $I_1$ through $I_K$ and the logic operation which the gate carries out. According to this invention, the successive logic states of the single elementary signal are represented by a function $f(i_{11}, \ldots, i_{1M}, i_{21}, \ldots, i_{k1}, \ldots, i_{K1}, \ldots, i_{KM})$ as:

$$f = g_1(i_{11}, i_{12}, \ldots, i_{1M}) \quad (1)$$
$$L\ g_2(i_{21}, i_{22}, \ldots, i_{2M})$$
$$L \ldots$$
$$L\ g_k(i_{k1}, i_{k2}, \ldots, i_{kM})$$
$$L \ldots$$
$$L\ g_K(i_{K1}, i_{K2}, \ldots, i_{KM}),$$

where L represents one of the logic operations. In Equation (1), $g_1$ through $g_K$ represent first through K-th successions of the logic states of the elementary signals $I_1$ through $I_K$.

For one logic operation L, the logic states represented by the function f are determined by first through M-th permutations $(i_{11}, i_{21}, \ldots, i_{k1}, \ldots, i_{K1})$, $(i_{12}, i_{22}, \ldots, i_{k2}, \ldots, i_{K2}), \ldots, (i_{1m}, i_{2m}, \ldots, i_{km}, \ldots, i_{Km}), \ldots, (i_{1M}, i_{2M}, \ldots, i_{kM}, \ldots, i_{KM})$ which are different from one another. The number M is therefore equal to the number of permutations of two things taken K at a time with repetition, that is, $2^K$.

It is understood that the logic states of the first through the K-th elementary signals need not time sequentially be dealt with. Instead, the logic states may simultaneosuly be treated as the first through the K-th "successions" $g_1$ to $g_K$ although time sequential treatment is necessary here and there in the dynamic gate array as will shortly become clear.

Each "succession" is also a permutation with repetition and will be called a row permutation when it is necessary to distinguish it from each of the first through the M-th permutations. In contrast to the row permutation or permutations, each of the first through the M-th permutations will be referred to as a column permutation.

A controller 11 is supplied with the function f and the first through the K-th (row) permutations ($i_{k1}$ to $i_{kM}$)

and produces first through K-th access signals $r_1$ to $r_K$ indicative of the first through the K-th elementary signals $I_1$ to $I_K$. A permutation memory 12 has a plurality of memory elements which are accessible by the access signals and are loaded with the first through the K-th permutations $g_1$ to $g_K$ from the controller 11. The controller 11 loads a gate memory 13 with the logic operation L in accordance with the function f. The gate memory 13 is so named because it simulates the logic operation of an AND, OR, or EOR gate.

At the outset of operation, a flip-flop set 14 is loaded with initial values of binary ones and zeros when the logic operation L is the AND operation and the OR or the EOR operation, respectively. It is possible to understand that the initial values are supplied to the set 14 from the gate memory 13 upon start of the operation.

When the access signal r (suffix omitted) indicates the k-th elementary signal $I_k$, the permutation memory 12 supplies the k-th permutation $g_k$ to the gate memory 12. As will presently become clear, the initial values are already rewritten at this instant in the set 14 into a previous result which is previously provided by the gate memory 13 when the (k−1)-th elementary signal is indicated. The previous result represents a (k−1)-th partial function $f_{k-1}$ given by:

$$f_{k-1} = g_1 L g_2 L \ldots L g_{k-1}.$$

The set 14 supplies the previous result to the gate memory 13, which carries out the logic operation L on the k-th permutation $g_k$ and the (k−1)-th partial function $f_{k-1}$ to provide a new result representative of a k-th partial function $f_k$ given by:

$$f_k = g_1 L g_2 L \ldots L g_{k-1} L g_k.$$

The gate memory 13 stores the new result in the set 14 in place of the previous result. When the K-th elementary signal $I_K$ is eventually indicated, the set 14 is loaded with the function $f(i_{11}, \ldots, i_{KM})$.

In connection with the above, the fact should be taken into consideration that the number M of elements in each of the first through the K-th permutations equal to $2^K$. It is therefore preferred to divide the dynamic simulation into a plurality of steps when the number K of the elementary signals supplied to the gate is considerably great. If a gate block be simulated, which produces a plurality of elementary signals, the gate block should be simulated also in steps. By the way, the (row) permutations will be designated, rather than by the reference symbols for the logic states as $g_k$, by the reference symbols for the respective elementary signals as $I_k$ which the respective permutations are representative of.

Figures 2, 4:
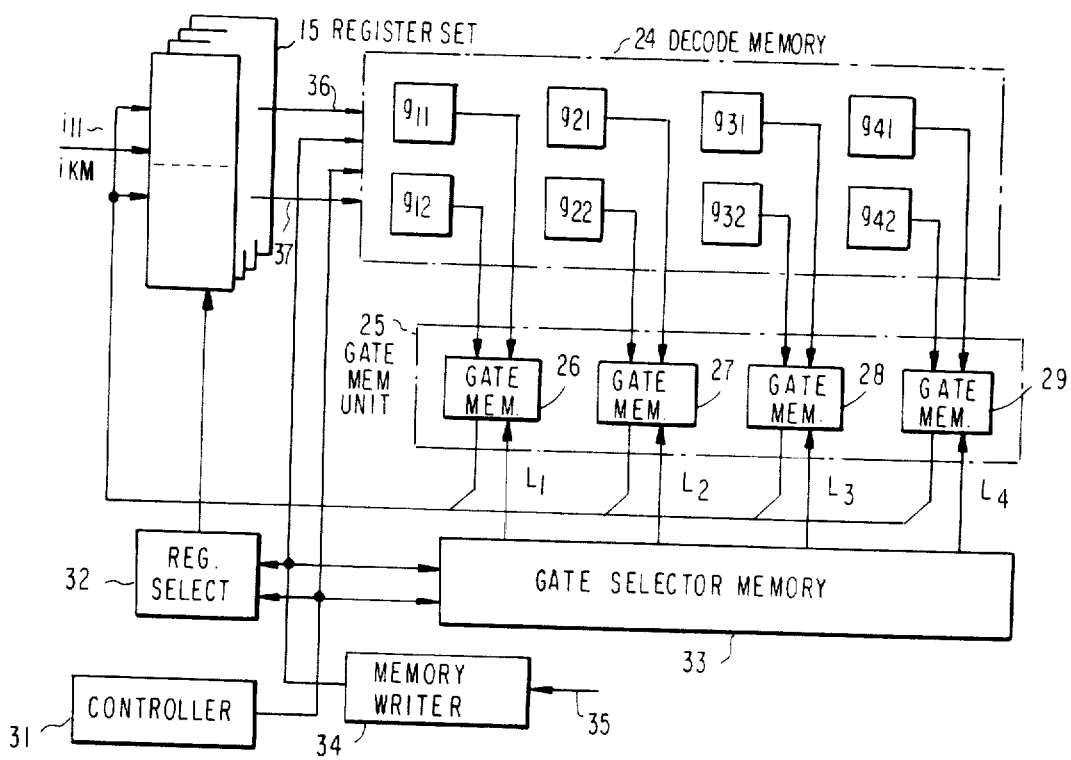
FIG. 2 is a block diagram of a dynamic gate array according to a practical embodiment of this invention.
FIG. 4 exemplifies allotment of various registers of the dynamic gate array shown in FIG. 2 to logic signals used by the dynamic gate array.
Figure 3:
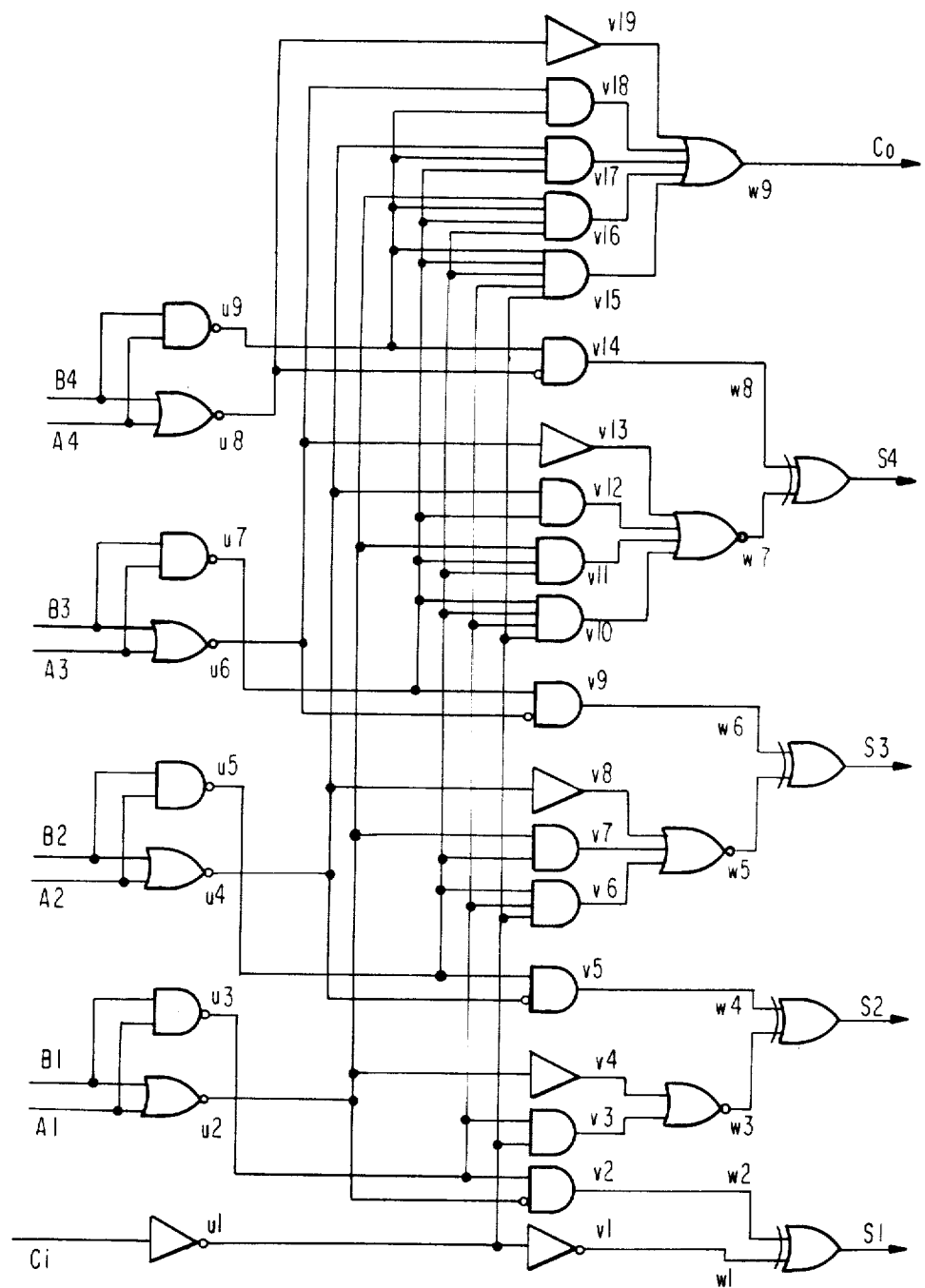
FIG. 3 shows a four-bit full adder in a block form which will facilitate an understanding of the dynamic gate array depicted in FIG. 2.

Referring now to FIGS. 2 and 3, a dynamic gate array according to a more general and practical embodiment of this invention (FIG. 2) will be described. It will be presumed for clarity of description that a four-bit full adder (FIG. 3) is to be implemented or wired in a custom LSI as a gate assembly and that the dynamic gate array is for use in dynamically simulating the four-bit full adder.

As is well known in the art of logic circuits, the four-bit full adder comprises various gates connected to one another in a predetermined manner of connection which is herein depicted with the gates divided into first through fourth levels in compliance with flow of the elementary signals through the four-bit full adder. The first through the fourth levels comprise first through fourth gate blocks. Some of the gate blocks include a mere connection, which will be surmised as a single input AND gate as noted before.

The first gate block is supplied with a one-bit input carry Ci, a first four-bit signal A1, A2, A3, and A4, and a second four-bit signal B1, B2, B3, and B4 as a first block input signal or a primitive signal and produces a first block output signal comprising elementary signals u1, u2, u3, u4, u5, u6, u7, u8, and u9. The symbols A1 through A4 and B1 through B4 represent elementary signals, respectively. The second gate block is supplied with the first block output signal as a second block input signal and produces a second block output signal comprising elementary signals v1, v2, v3, v4, v5, v6, v7, v8, v9, v10, v11, v12, v13, v14, v15, v16, v17, v18, and v19. The third gate block is supplied with the second block output signal as a third block input signal and produces a third block output signal comprising elementary signals w1, w2, w3, w4, w5, w6, w7, w8, and w9. The fourth gate block is supplied with the third block output signal as a fourth block input signal and produces a four-bit sum signal S1, S2, S3, and S4 and a one-bit output carry Co as a fourth block output signal, namely, a derived signal.

Each of the first, the second, and the fourth block input signals consists of nine elementary signals. The third block input signal consists of as many as ninteen elementary signals. If output terminals of the four-bit full adder are considered as a fifth "gate block" on a fifth level, a fifth block input signal consists of only five elementary signals. It is unnecessary for the dynamic simulation carried out by the dynamic gate array that the number of elementary signals in the block input or output signal of a certain one gate block be always as exemplified above.

Inasmuch as each gate block is supplied with an appreciably great number of elementary signals and produces a plurality of elementary signals, the gate block is dynamically simulated in steps. For this purpose, each gate block is divided into a plurality of logic groups which collectively represent or simulate the gate block under consideration. The block input signal is likewise divided into a plurality of (group) input signals for the respective logic groups. It is now possible to dynamically simulate the four-bit full adder by extending the principles decribed in conjunction with FIG. 1. Incidentally, each input signal should preferably consist of eight or less elementary signals as will later become clear.

More specifically, the four-bit full adder is dynamically simulated as a combination or assembly of logic groups. By way of example, the first gate block is simulated as first through third logic groups. The first logic group is given the permutations Ci, A1 through A3, and B1 through B3 as a first (group) input signal and provides the permutations u1 through u4 as a first (group) output signal. The second logic group is again given the first input signal as a second input signal to provide the permutations u5 through u7 as a second output signal. The third logic group is supplied with the permutations u4 and B4 as a third input signal to provide the permutations u8 and u9 as a third output signal. Other logic groups will later become clear.

The dynamic gate array simulates such logic groups in successive steps of simulation as will presently be exemplified. For example, the first through the third logic groups are simulated in first through third steps.

In FIG. 2, the dynamic gate array comprises a register set 15 which corresponds to the flip-flop set 14 as will shortly become clear. The register set 15 is for storing, from time to time, logic signals assigned to the steps of simulation. In order to facilitate description of the logic signals, the first through the third steps of simulation for the first gate block will collectively be referred to as a first level operation or briefly as a level 1 operation. The steps for the second through the fourth gate blocks will similarly be called level 2 through 4 operations. A few other levels (of operation) will appear in the following.

Referring to FIG. 4 in addition to FIGS. 2 and 3, the register set 15 comprises first through fourth registers R1, R2, R3, and R4, each capable of storing eight eight-bit signals. As indicated in FIG. 2 by a deshed line, each register is divided into a first and a second half, which may be called an upper and a lower half. The uppur and the lower halves of the respective registers will be denoted by R1U, R1L, R2U, and so forth.

In preparation for the level 1 operation, the first register R1 is loaded with the permutations Ci, A1 through A3, and B1 through B3 as seven logic signals assigned to the first step as well as to the second step. The second register R2 is loaded with the permutations A4 and B4 as two logic signals assigned to the third step. Upon completion of the level 1 operation, four permutations u1 through u4 are stored in the upper half of the third register R3U as logic signals assigned to the first step. Three permutations u5 through u7 are stored in the upper half of the fourth register R4U as logic signals assigned to the second step. Two permutations u8 and u9 are stored in the lower half of the fourth register R4L as logic signals assigned to the third step.

For use in the level 2 operation, it is desirable to rearrange the first through the third output signals stored in the third and the fourth registers R3 and R4. The rearrangement is carried out as a level 1' operation. After completion of the level 1' operation, the permutations u5 through u7 and u9 are stored in the lower half of the third register R3L. It will readily be understood from FIG. 3 that the permutation u8 need not be stored in the third register R3.

The third register R3 is loaded with eight permutations u1 through u7 and u9 before start of the level 2 operation. The fourth register R4 is loaded with five permutations u5 through u9. As a result of the level 2 operation, the first register R1 is loaded with five permutations v1 through v5. The second register R2 is loaded with eight permutations v6 through v13. The third register R3 is loaded with five permutations v15 through v19. The fourth register R4 is loaded with only one permutation v14.

The permutations stored in the first through the fourth registers R1 to R4 are used in the level 3 operation without rearrangement. At the end of the level 3 operation, the first register R1 is loaded with six permutations w1 through w6. The second register R2 is loaded with two permutations w7 and w8. The remaining permutation w9 is stored in the third register R3.

The permutations are used in the level 4 operation as they are. As shown as a level 5 operation, four permutations S1 through S4 and one permutation Co obtained as a result of the level 4 operation, are stored in the first and the second registers R1 and R2, respectively. In order to collect five permutations S1 through S4 and Co altogether in the first register R1, the permutation Co is moved from the second register R2 to the first register R1. This rearrangement is indicated as a level 5' operation.

Figure 5:
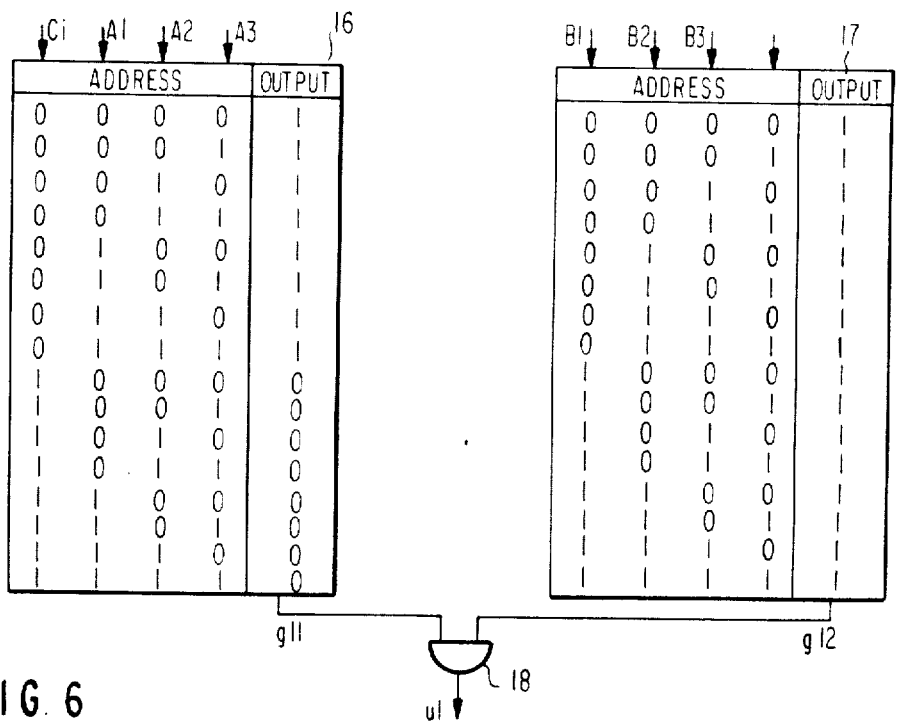
FIG. 5 is a block diagram of parts of a decode memory and a gate memory unit of the dynamic gate array illustrated in FIG. 2.

Referring additionally to FIG. 5, seven permutations Ci, A1 through A3, and B1 through B3 stored in the first register R1 as the logic signals assigned to the first step, are divided into a first and a second part, each consisting of four or less permutations. This is in order to individually simulate the logic operations carried out in the first logic group to provide the permutations u1 through u4 by the use of the seven permutations. It is noted at first that the elementary signal u1 is given by the inverted signal of the elementary signal Ci. The permutation u1 is obtained by the use of two RAM's 16 and 17 accessed by the first and the second parts, respectively, to produce first and second logic functions $g_{11}$ and $g_{12}$ and a gate 18 for carrying out, for the instant case, the AND operation on the logic functions $g_{11}$ and $g_{12}$.

For access by four or less row permutations, each RAM 16 or 17 has sixteen addresses. This is because the number of column permutations for four row permutations is equal to $2^4$, namely, 16. Each address is for storing one bit.

As is the case with Equation (1), the permutation u1 is given by:

$$u1 = g_{11}(Ci, A1, A2, A3) \quad L_1 g_{12}(B1, B2, B3), \tag{2}$$

where $L_1$ represents a logic operation of AND. In contrast to the row permutation $g_k$ used in Equation (1), each logic function $g_{ij}$ is dependent on the column permutations for the row permutations given as arguments of the logic function in question.

In Equation (2), the first logic function $g_{11}$ represents a set of logic one and/or zero states as dependent variables. The dependent variable set is decided by the first logic group for a set of logic one and/or zero states given as independent variables by the first part of the first input signal. A pattern or list which defines such a dependent variable set for an independent variable set, is herein called a decoding pattern. The decoding pattern under consideration is assigned to the first step. The decoding pattern is preliminarily stored in the RAM 16 which is accessed by the first part.

The other RAM 17 is for similarly storing another decoding pattern for the second logic function $g_{12}$. The decoding pattern is nevertheless depicted as defining a set of sixteen dependent variables for a set of sixty-four inpedendent variables. If at least one of four address signals is unnecessary as in this case, the at least one address signal is given optional logic states.

It is possible to make the RAM's 16 and 17 simultaneously produce the dependent variables of the respective sets. In this event, the AND gate 18 should be understood to represent sixteen partial AND gates for producing eight logic one and/or zero bits as elements of the permutation u1.

Figure 6:
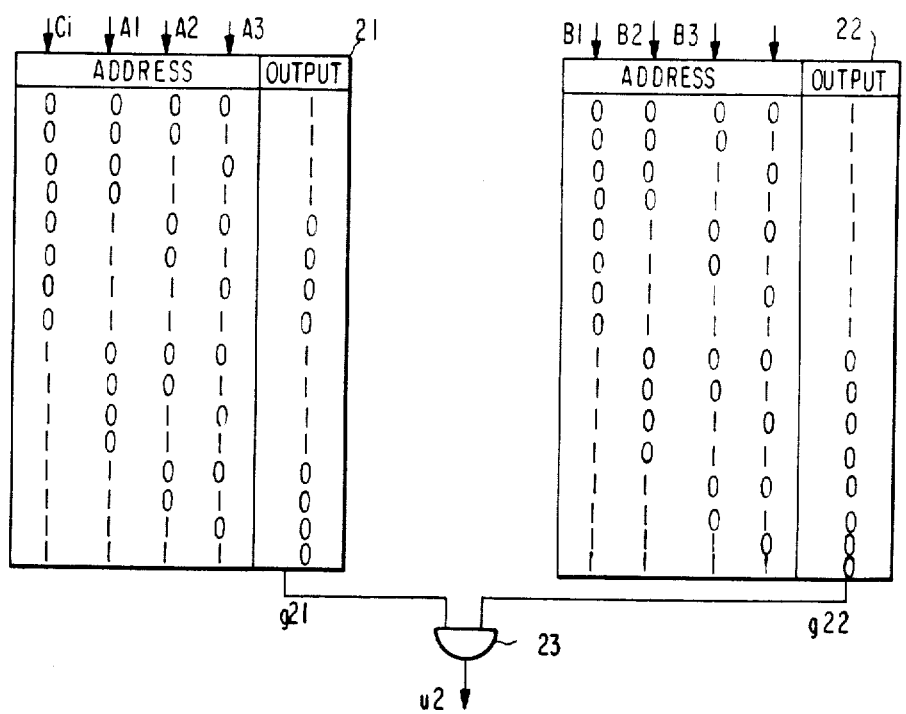
FIG. 6 is a block diagram of other parts of the decode memory and the gate memory unit which are mentioned in conjunction with FIG. 5.

Turning to FIG. 6, the elementary signal u2 (FIG. 3) is given by the NOR operation for the elementary signals A1 and B1 and accordingly by the AND operation for the inverted signals of the elementary signals A1 and B1. The permutation u2 is therefore given by:

$$u2 = g_{21}(Ci, A1, A2, A3) \quad L_2 g_{22}(B1, B2, B3), \tag{3}$$

where $L_2$ again represents the AND operation. In Equation (3), $g_{21}$ and $g_{22}$ are referred to also as logic functions. Two other RAM's 21 and 22 are used for storing decoding patterns for the respective logic functions $g_{21}$ and $g_{22}$. An AND gate 23 is depicted in producing the permutation u2.

Figure 7:
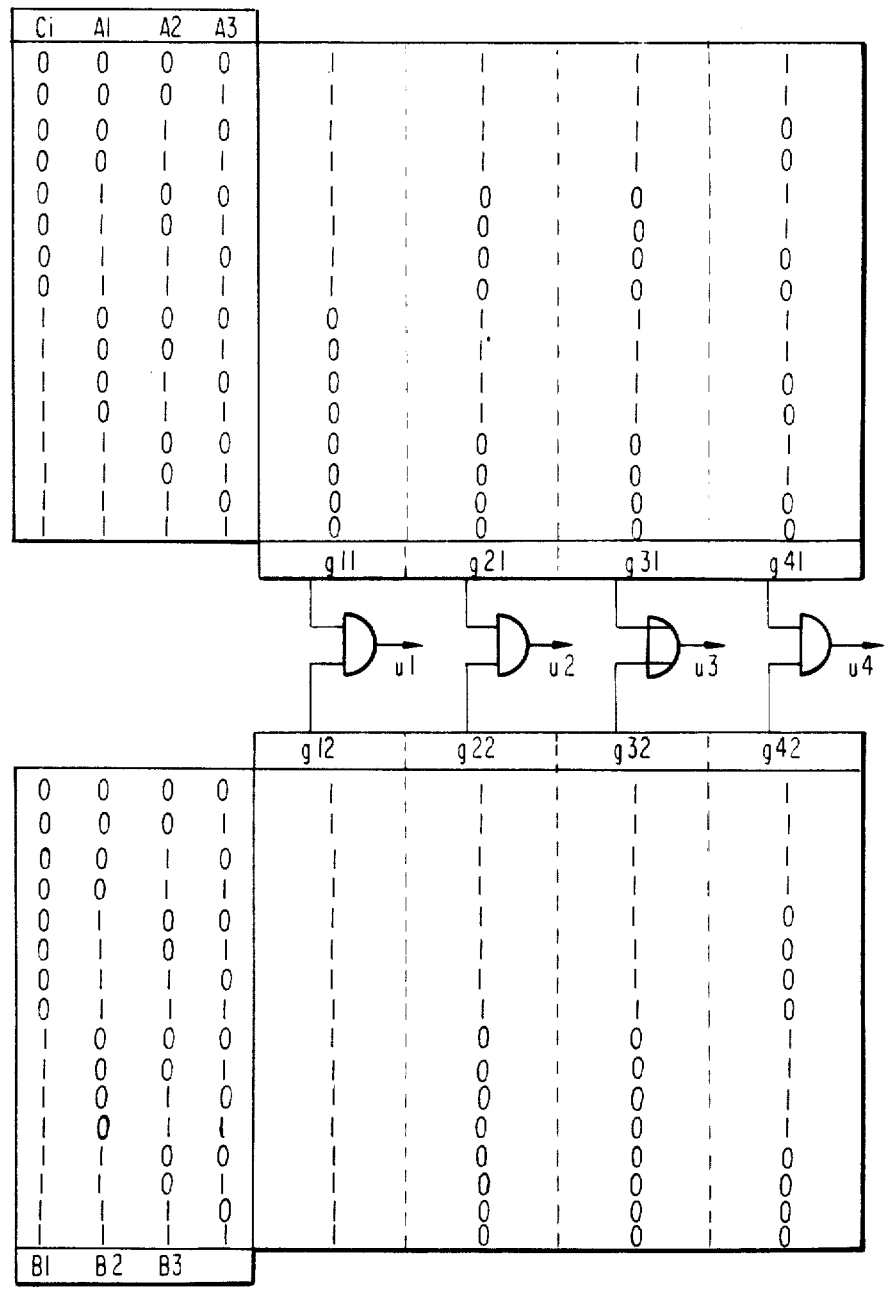
FIG. 7 diagrammatically shows a plurality of decoding patterns which include those depicted in the decode memory parts depicted in FIGS. 5 and 6, together with gates.

Turning further to FIG. 7, the decoding patterns for the logic functions $g_{11}$, $g_{12}$, $g_{21}$, and $g_{22}$ are shown in a simplified form. As described above, the permutations u1 and u2 are provided by the AND operations for the dependent variable sets $g_{11}$ and $g_{12}$ (the symbols for the logic functions being used) and for the other dependent variable sets $g_{21}$ and $g_{22}$.

The elementary signal u3 (FIG. 3) is given by the NAND operation for the elementary signals A1 and B1 and consequently by the OR operation for the inverted signals of the elementary signals A1 and B1. The permutation u3 is therefore provided by the OR operation on dependent variable sets $g_{31}$ and $g_{32}$ given by decoding patterns for the logic function $g_{31}$ and $g_{32}$. It will now be readily feasible for one skilled in the art of logic circuits to decide the decoding patterns for the dependent variable sets $g_{31}$ and $g_{32}$.

The remaining elementary signal u4 (FIG. 3) to be obtained during the first step of simulation, is determined by the NOR operation on the elementary signals A2 and B2 and therefore by the AND operation on the inverted signals of the elementary signals A2 and B2. The permutation u4 is provided by the AND operation on dependent variable sets $g_{41}$ and $g_{42}$ defined by decoding patterns for logic functions $g_{41}$ and $g_{42}$.

Summarizing, eight decoding patterns for the logic functions $g_{11}$, $g_{12}$, ..., and $g_{42}$ are assigned to the first step for use in the first step of simulation. The dependent variable sets $g_{11}$, $g_{12}$, ..., and $g_{42}$ defined by the respective decoding patterns, are decided by the first logic group for the independent variable sets represented by the first input signal consisting of the permutations Ci, A1 through A3, and B1 through B3. The first input signal is given by those of the logic signals assigned to the first step which are stored in the first register R1 (FIG. 4).

Referring to FIG. 8 in addition to FIGS. 2 through 4, a decode memory 24 (FIG. 2) corresponds to the permutation memory 12 (FIG. 1). The decode memory 24 comprises a plurality of memory elements, such as the RAM's 16 and 21 (FIGS. 5 and 6), for the decoding patterns $g_{11}$, $g_{21}$, $g_{31}$, and $g_{41}$ (the symbols for the logic functions and also for the dependent variable sets being used). Similar memory elements are for the decoding patterns $g_{12}$, $g_{22}$, $g_{32}$, and $g_{42}$. A gate memory unit 25 comprises first through fourth gate memories 26, 27, 28, and 29, each of which corresponds to the gate memory 13 (FIG. 1).

A controller 31 is for successively specifying the steps of simulation. Each of a register selector 32 and a gate selector memory 33 has a plurality of memory segments (not shown) accessible by the specified steps.

In preparation for operation, a memory writer 34 loads the respective memory segments of the register selector 32 with selection signals for use in selecting the registers R1 through R4 and, as the case may be, the halves thereof as indicated in FIG. 8 according to the steps in the level 1 through 4' operations. The level 4' operation corresponds to the level 5 and 5' operations shown in FIG. 4. Moreover, the memory writer 34 loads the memory segments of the gate control memory 33 with first through fourth indication signals $L_1$, $L_2$, $L_3$, and $L_4$ (the symbols $L_1$ and $L_2$ being used in Equations (2) and (3) and also in FIGS. 5 and 6) which renders the first through the fourth gate memories 26 to 28 operable as indicated also in FIG. 8. The memory writer 34 still further loads the first and the second registers R1 and R2 (FIG. 4) with nine permutations Ci, A1 through A4, and B1 through B4 representative of the primitive signal. The memory writer 34 yet further stores the decoding patterns, such as $g_{11}$ through $g_{42}$, in the memory elements of the decode memory 24. It is possible to make the memory writer 34 so to operate by supplying various data thereto as a signal 35. Alternatively, various circuit elements may be supplied with the respective data as exemplified at $i_{11}$ to $i_{KM}$ for the primitive signal.

With this, the dynamic gate memory is loaded with data for use in dynamically simulating the four-bit full adder. Stated otherwise, the four-bit full adder is implemented in the dynamic gate array. Incidentally, a program for dynamically simulating the four-bit full adder or a like gate assembly, should preliminarily be designed by manual operation as exemplified in FIGS. 4 and 8.

When given a request to start the dynamic simulation of the four-bit full adder, the controller 31 specifies the first step. A memory segment is accessed in the register selector 32, in which a selection signal is stored to select the first register R1 and the upper half of the third register R3U as indicated in FIG. 8 along the top line. A memory segment is accessed in the gate selector memory 33, in which an indication signal is stored for indicating the AND, AND, OR, and AND operations to the first through the fourth gate memories 26 to 28 as shown in FIG. 8 also along the top line. The gate memories 26 through 28 are rendered operable to carry out the indicated logic operations. In addition, the decode memory 24 is given a direction to make the memory elements operable where the decoding patterns $g_{11}$, $g_{12}$, ..., and $g_{42}$ assigned to the first step, are stored as shown in FIG. 7.

As described in conjunction with FIG. 4, the first register R1 is loaded with seven permutations Ci, A1 through A3, and B1 through B3. Signals indicative of four permutations Ci and A1 through A3 are simultaneously delivered to all the memory elements $g_{11}$ through $g_{41}$ as address signals collectively indicated at 36. Signals indicative of three permutations B1 through B3 are fed to all the memory elements $g_{21}$ through $g_{42}$ as address signals indicated at 37.

Responsive to the address signals 36 and 37, the memory elements $g_{11}$, $g_{12}$, ..., and $g_{42}$ simultaneously supply the dependent variable sets to the gate memories 26 through 28. The gate memory unit 25 produces the logic one and/or zero states in parallel for the permutations u1 through u4. The permutations u1 through u4 are stored in the upper half of the third register R3U being selected as those logic signals assigned to the first step which collectively serve as the first (group) output signal.

It is possible to make the address signal 36 serially indicate the respective elements of the permutations Ci and A1 through A3. In this event, the gate memory unit 25 produces each of the permutations u1 through u4 bit by bit in series. Alternatively, it is possible to make the gate memory unit 25 produce the permutations u1 through u4 in series as well as in parallel.

The controller 31 is timed so as to indicate the second step upon storage of the permutations u1 through u4 in the upper half of the third register R3U. In the second step, the register selector 32 selects the first register R1 again and the upper half of the fourth register R4U as indicated in FIG. 8 along a second line. The gate selector memory 33 makes the first through the third gate memories 26 to 28 carry out the OR, AND, and OR operations, respectively, as indicated also in the second line.

In this manner, the controller 31 eventually indicates the last step indicated in FIG. 8 along the bottom line, namely, along the lower line in the level 4' operation. As described before, the level 4' operation corresponds to the level 5' operation described in connection with FIG. 4. In the last step, the permutation Co is moved from the second register R2 to the lower half of the first register R1L.

It is now possible to check whether or not the operation of the four-bit full adder is correct. As the case may be, the operation should be checked in the meanwhile as regards the group output signal or signals, such as u1 through u4.

While this invention has so far been described with reference to the accompanying drawing, it will now readily be possible for one skilled in the art to carry this invention into effect in various other manners. For example, it may be that a logic circuit composed of a certain assembly of gates is not divisible as exemplified above. In this event, the dynamic gate array should deal with a gate block as a whole as a logic group.

What is claimed is:

1. A dynamic gate array for simulating an overall operation carried out by a combination of logic groups on a primitive signal to provide a derived signal, said logic groups being responsive to input signals for providing output signals, respectively, and being operable in steps in response to said primitive signal given as a particular one of said input signals to eventually provide a specific one of said output signals as said derived signal, said dynamic gate array comprising:

register means for storing a plurality of logic signals assigned to said steps;

decode memory means for memorizing a plurality of decoding patterns assigned to said steps, each decoding pattern defining a set of dependent variables for a set of independent variables, the dependent variable sets being decided by said logic groups for the independent variable sets which said input signals are representative of;

gate memory means for memorizing a plurality of logic operations assigned to said steps; and step specifying means for successively specifying said steps for said logic signals, said decoding patterns, and said logic operations to specify, when each step is specified, at least one of said logic signals, at least two of said decoding patterns, and at least one of said logic operations, said at least one logic signal collectively serving as one of said input signals, said step specifying means thereby providing those at least two of said dependent variable sets which are defined by said at least two decoding patterns for those at least two of said dependent variable sets which the last-mentioned one input signal is representative of, subjecting said at least two dependent variable sets to said at least one logic operation to provide one of said output signals, and storing the last-mentioned one output signal in said register means as at least one of said logic signals that is assigned to the step being specified.

2. A dynamic gate array as claimed in claim 1, wherein each input signal consists of eight logic signals.

3. A dynamic gate array as claimed in claim 2, wherein each logic signal is given by a permutation of either of a sequence of logic one states, a sequence of logic zero states, and a sequence of logic one and zero states, said permutation having elements equal in number to sixteen.

* * * * *